(12) United States Patent
Olligs

(10) Patent No.: US 7,531,867 B2
(45) Date of Patent: May 12, 2009

(54) METHOD FOR FORMING AN INTEGRATED MEMORY DEVICE AND MEMORY DEVICE

(75) Inventor: Dominik Olligs, Dresden (DE)

(73) Assignee: Infineon Technologies AG, Munich (DE)

( * ) Notice: Subject to any disclaimer, the term of this patent is extended or adjusted under 35 U.S.C. 154(b) by 284 days.

(21) Appl. No.: 11/390,983

(22) Filed: Mar. 27, 2006

(65) Prior Publication Data

US 2007/0224759 A1 Sep. 27, 2007

(51) Int. Cl.
*H01L 29/94* (2006.01)
(52) U.S. Cl. .................. 257/324; 257/325; 257/390; 257/E29.309
(58) Field of Classification Search .............. 257/324, 257/325, 390, 391, E29.309, 208, 209
See application file for complete search history.

(56) References Cited

U.S. PATENT DOCUMENTS

2002/0030281 A1* 3/2002 Jung ........................ 257/774
2002/0132430 A1   9/2002 Willer et al.
2003/0001177 A1* 1/2003 Okutoh et al. ............ 257/295

* cited by examiner

*Primary Examiner*—Minh-Loan T Tran
(74) *Attorney, Agent, or Firm*—Slater & Matsil, L.L.P.

(57) ABSTRACT

The invention in one of the embodiments refers to a method for forming an integrated memory device, the method including a forming a plurality of bitlines, wherein forming the plurality of bitlines includes forming diffusion lines in a substrate, forming an electrically conductive silicidation barrier layer on a substrate surface exposed, and depositing a conductive layer comprising a metal on the silicidation barrier layer.

26 Claims, 6 Drawing Sheets

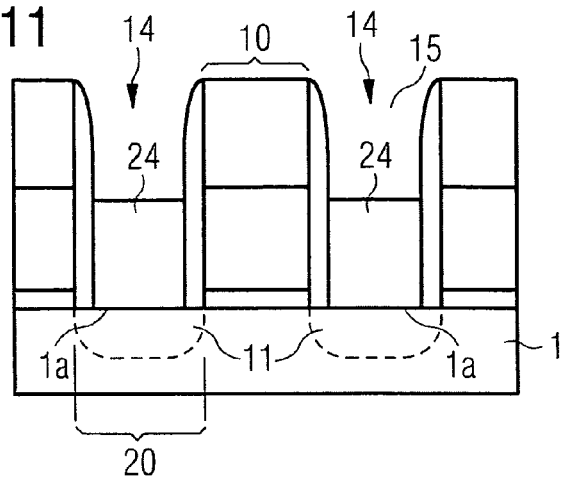
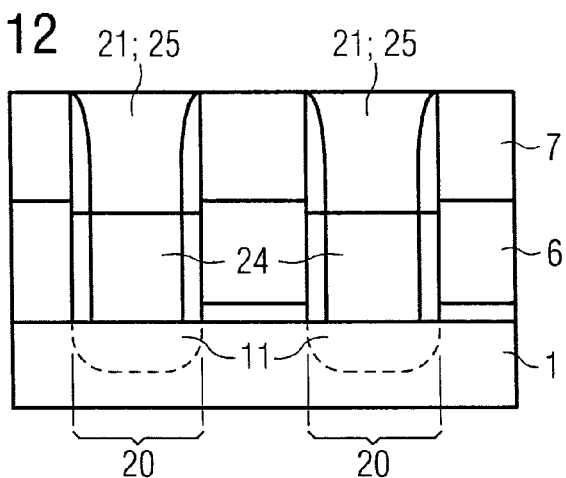
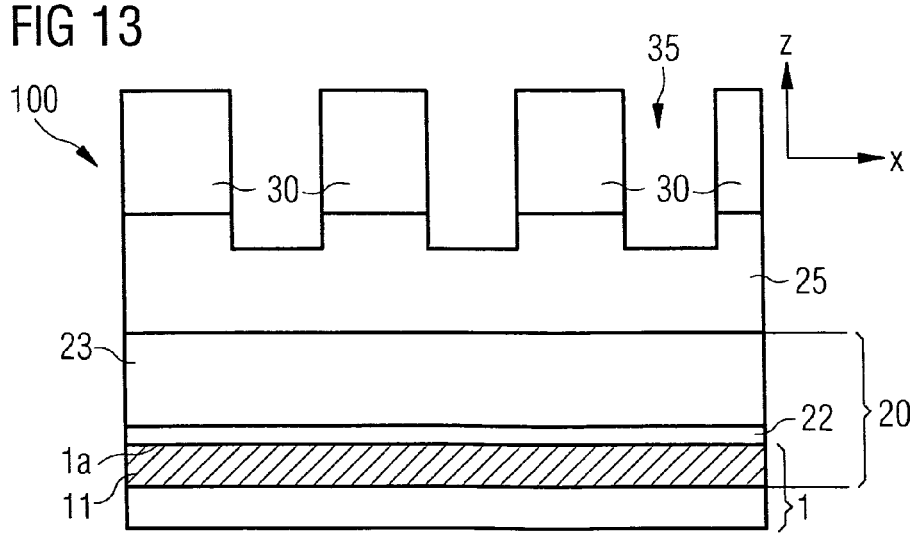

METHOD FOR FORMING AN INTEGRATED MEMORY DEVICE AND MEMORY DEVICE

TECHNICAL FIELD

The present invention relates generally to semiconductor devices, and more particularly to a method for forming an integrated memory device and memory device.

BACKGROUND

The invention refers to an integrated memory device and to a method for the manufacture thereof. Integrated memory devices comprise a memory array with a plurality of memory cells connected to first and second conductive lines usually called bitlines and wordlines. The memory cells may be volatile or non-volatile memory cells. Volatile memory cells require repeated refreshing of the stored information whereas non-volatile memory cells enable permanent storage of digital information. Non-volatile memory cells for instance may comprise floating gate transistors. Another kind of non-volatile memory cell are NROM cells (nitride read only memory). NROM cells comprise a charge-trapping layer like a silicon nitride layer sandwiched between two opposed dielectric layers. The stack of layers formed thereby represents the gate oxide disposed on a channel region between two source/drain-regions. High energy charge carriers may be scattered into the silicon nitride layer close to one of the source/drain regions upon transistor channel formation. The scattered charge carriers (electrons or holes) remain stored in the silicon nitride layer in locally bound positions. Accordingly an NROM cell may store at least one bit at each lateral end close to the respective source/drain region, further bits being storable in case of multi-level cells controlling the amount of electrical charges by means of the magnitude of electrode voltages applied.

Flash memory devices comprise memory cells being individually programmable but being erasable only commonly within the respective sector of memory cells. The memory array of a flash memory device comprises a plurality of sectors. When an erase operation is performed, all memory cells of one or more sectors are simultaneously erased. On the other hand, flash memory devices comprise memory arrays of comparatively high density of memory cells per substrate surface area. Each NROM transistor cell includes a portion of a charge-trapping layer capable of storing two or more digital information. The charge-trapping layer stack forms part of the gate stacks which further comprise, at least, a first gate conductor layer.

The gate stacks are formed by first depositing and patterning a first stack of layers containing an ONO layer (oxide-nitride-oxide) and at least the first gate conductor layer. Thereby a plurality of patterned line structures extending along a first direction parallel to one another is formed. Subsequently, bitlines are formed in the substrate between the patterned line structures. Conventionally the bitlines are constituted by dopant implanted into the substrate, the dopants forming diffusion bitlines reaching, in lateral direction, closed to the ONO-stack of the patterned line structures. Accordingly, the patterned line structures are used as a mask for implantation of the dopants for the bitlines (that is the source/drain regions) into the substrate. Conventionally, after filling the spaces between the patterned line structures with dielectric material, further layers are deposited and patterned, thereby forming the wordlines. Patterning includes etching through the patterned line structures, thereby forming trenches extending along a second direction perpendicular to the first direction. Thereby wordlines extending perpendicular to the bitlines are formed. Furthermore, the patterned line structures are cut through during patterning as to obtain a plurality of gate stacks of approximately quadratic contour in lateral direction. Thereby each patterned line structure formed prior to bitline implantation is patterned to obtain a plurality of gate stacks.

Whereas the wordlines are highly conductive due to metal layers deposited above the gate stacks, the buried diffusion bitlines have a somewhat increased ohmic resistance compared to the wordlines due to the circumstance that the doped diffusion region in the silicon substrate is less conductive than a metal layer. Though in principle the concentration of dopants in the diffusion lines arranged between the gate stacks might be increased, with view to subsequent thermal treatment steps the allowable maximum dopant concentration in the substrate is limited.

As a consequence of the increased ohmic resistance of the diffusion bitlines compared to the wordlines, the number of memory cells reliably controllable per bitline is limited. It would be desirable to increase the number of memory cells connectable to and reliably operable by a bitline. Therefore the conductivity of the bitline must be increased.

In principle it would be possible to deposit a metal layer between the patterned line structures on those substrate surface portions where the diffusion bitlines are provided. However, at the interface surface between a metal layer and the semiconductor substrate surface a Schottky contact would be formed that would shift the electrical potential of the source/drain regions compared to the bitline potential. Furthermore, many metals tend to form a metal silicide during heat treatment steps performed in the manufacture of the semiconductor device, for instance in order to diffuse the implanted dopants. Often temperatures above 600° C. are required for sufficient heat treatment effects. At such high temperatures many metal suicides are subject to a phase transition, thereby physically changing the microscopic crystal lattice of the respective metal silicide material. Due to the phase transition of the metal silicide, the electric contact between the metal layer and the diffusion line is further deteriorated. These effects undermine the intention of increasing the bitline conductivity.

It would be useful to increase the conductivity of bitlines in integrated memory devices, thereby enabling reliable control of a larger number of memory cells per bitline. It would also be useful to overcome the drawback of silicide formation in bitlines comprising a diffusion line and a further line of a higher conductivity compared to the diffusion line. It might also be useful to provide an integrated memory device and a process of manufacture thereof, which allow easier control of the source/drain region potentials by means of the bitline potential.

SUMMARY OF THE INVENTION

One embodiment of the invention provides a method for forming an integrated memory device. A substrate having a substrate surface is provided. A first stack of layers is deposited on the substrate. The first stack of layers includes at least a first dielectric layer arranged over the substrate and a first gate conductor layer arranged over the first dielectric layer. The first stack of layers is patterned to obtain a plurality of patterned line structures extending along a first direction parallel to the substrate surface and being separated, in a second direction different from the first direction, by longitudinal spaces. A plurality of bitlines is formed and an insulating layer covers the bitlines. A second stack of layers is deposited.

The second stack of layers is patterned to form a plurality of a wordlines extending along the second direction and being separated from one another along the first direction. The patterned line structures are patterned in regions exposed between the wordlines, thereby forming a plurality of gate stacks. In a preferred embodiment, the plurality of bitlines are formed by forming diffusion lines in the substrate between the patterned line structures. An electrically conductive silicidation barrier layer is formed over the substrate surface exposed between the patterned line structures. A metal layer is deposited over the silicidation barrier layer.

According to the above method of the invention, forming of the bitlines includes formation of diffusion lines in the substrate as well as formation of an electrically conductive silicidation barrier layer on the substrate, followed by deposition of a conductive layer comprising a metal. According to an embodiment of the invention the conductive layer is formed on those regions of the substrate surface where the diffusion lines have been implanted into the substrate. Accordingly, an electrically conductive silicidation barrier layer is formed in contact with the substrate surface that is in contact with the diffusion lines.

Furthermore, according to an embodiment of the invention the silicidation barrier layer is covered with a conductive layer comprising a metal, preferably with a metal layer. The metal layer provides a highly increased conductivity of the bitlines. However, due to the silicidation barrier layer interposed between the conductive metal lines and the buried diffusion lines, no silicidation can occur and no phase transition of a metal silicide can occur. Accordingly, bitline conductivity is increased and the number of memory cells reliably controllable per bitline is increased.

Furthermore, in case of non-metallic silicidation barrier layers, no Schottky contact is formed at the substrate surface on top of the diffusion lines.

In a preferred embodiment the silicidation barrier layer is deposited and etched back, thereby forming first conductive line portions in each space between the patterned line structures, the first conductor line portions covering the substrate surface. Silicidation barrier layer deposition may be non-conformal, for instance.

In a preferred embodiment the conductive layer comprising the metal is deposited and etched back, thereby forming second conductor line portions in each space between the patterned line structures, the second conductor line portions covering the first conductor line portions. The first conductor line portions comprise a material preventing silicidation between the bottom surface of the second conductor line portions and the substrate surface.

In a preferred embodiment the first conductor line portions are formed after the diffusion lines have been formed in the substrate. Alternatively, a doped silicidation barrier layer might be provided, a subsequent step of heat treatment causing dopant outdiffusion, thereby forming the diffusion lines in the substrate. However, formation of the diffusion lines prior to formation of the first conductor line portions is preferred.

In a preferred embodiment, the first conductor line portions are formed on the diffusion lines exposed at the substrate surface between the spaces. In a preferred embodiment, the diffusion lines are formed by implanting a dopant into the substrate through the spaces between the patterned line structures. The dopants may be n-type dopants like arsene (As), for instance. In a preferred embodiment the dopants are implanted into the substrate before forming the first conductor line portions.

In a preferred embodiment, the silicidation barrier layer is formed of a material comprising a metal nitride. In particular the silicidation barrier layer may comprise titanium nitride. However, other nitrides except for silicon nitride may be used alternatively. Furthermore, a nitride comprising titanium and at least one further metal may be used as a silicidation barrier layer material. In any case, the silicidation barrier layer is a material that does not comprise silicon since otherwise silicidation would occur at the interface surface between this silicon-containing material and the second conductor line portions containing the metal.

In a preferred embodiment the conductive layer comprises one of aluminum, copper, tungsten, titanium, nickel and cobalt (Al, Cu, W, Ti, Ni and Co), respectively. In particular in case of tungsten, titanium, nickel and cobalt, there is a strong tendency of forming silicides when being in contact with silicon substrate material at high temperatures. Once a silicide intermediate layer is formed, continued heat treatment promotes phase transition of the silicide formed, thereby adversely affecting bitline conductivity.

A further embodiment of the invention provides a second method for forming an integrated memory device. A substrate having a substrate surface is provided. A first stack of layers is deposited on the substrate. The first stack of layers includes at least a first dielectric layer arranged over the substrate and a first gate conductor layer arranged over the first dielectric layer. The first stack of layers is patterned to obtain a plurality of patterned line structures extending along a first direction parallel to the substrate surface and being separated, in a second direction different from the first direction, by longitudinal spaces. A plurality of bitlines is formed and an insulating layer covers the bitlines. A second stack of layers is deposited. The second stack of layers is patterned to form a plurality of a wordlines extending along the second direction and being separated from one another along the first direction. The patterned line structures are patterned in regions exposed between the wordlines, thereby forming a plurality of gate stacks. In a preferred embodiment, the plurality of bitlines are formed by forming diffusion lines in the substrate between the patterned line structures and forming conductor line portions on the diffusion lines by epitaxially depositing a doped semiconductor material on the substrate surface exposed between the patterned line structures.

According to this second method conductor line portions are formed on the diffusion lines by epitaxially depositing a doped semiconductor material onto the substrate material. Thus, the epitaxially grown, highly doped semiconductor material increases the conductivity of the bit line. Furthermore, bitline cross-section gained by the doped semiconductor material is increased. Furthermore, since the semiconductor material is deposited epitaxially onto the substrate, no ohmic contact resistance at the interface between the substrate material and the epitaxially grown semiconductor material occurs. Thereby bitline conductivity is increased further. In a preferred embodiment the epitaxially grown semiconductor material is doped with a dopant concentration being higher than the dopant concentration of the diffusion lines in the substrate. Especially in case that the epitaxially grown material is formed after the diffusion lines have been formed in the substrate, the dopant concentration of the epitaxial semiconductor material may be chosen higher compared to the dopant concentration of the diffusion lines. Thereby bitline conductivity is increased without adversely affecting the switching behavior of the NROM cell transistors.

In a preferred embodiment a heavily doped semiconductor material is epitaxially deposited, the dopant concentration being larger than $10^{19}$ cm$^{-3}$.

In a preferred embodiment doped silicon is epitaxially grown on the substrate. In a preferred embodiment the substrate also comprises silicon.

In a preferred embodiment the diffusion lines are formed, prior to forming the conductor line portions, by implanting dopants into the substrate.

Hereinbelow some further preferred embodiments are described with reference to both the first and the second method according to the invention.

In a preferred embodiment, between patterning the first stack of layers and forming a plurality of bitlines, spacers are formed on sidewalls of the patterned line structures. The spacers are electrically insulating and therefore provide an electrical insulation between the gate stacks (to be formed of the patterned line structures) and the bitlines.

In a preferred embodiment oxide spacers are formed on the sidewalls of the patterned line structures. Oxide spacers like silicon oxide spacers serve to protect the bitlines from being exposed and short circuited during etching steps to be performed later (for instance when removing silicon nitride, which can be etched selectively to silicon oxide).

In a preferred embodiment, forming an insulating layer includes depositing the insulating layer and back etching the insulating layer, thereby forming conductor line portions in each space between the patterned line structures. In a preferred embodiment the insulating layer is etched back until the insulating layer is removed from top surfaces of the patterned line structures and in each trench a separate conductor line isolation is obtained.

In a preferred embodiment, the insulating layer is etched back until between 10% and 50% of the depth of the spaces are recessed. Accordingly, the portions of the bitline filling the spaces and the conductor line isolation covering the bitline together fill up between 50% and 90% of the depth of the spaces between the patterned line structures.

In a preferred embodiment, the first dielectric layer includes a charge-trapping layer between the two dielectric layers. The first gate conductor layer may be formed of doped polysilicon. The charge-trapping layer and the two dielectric layers on opposed sides of the charge-trapping form a charge-trapping layer stack.

In a preferred embodiment, a cap dielectric layer is deposited on the first gate conductor layer. The cap dielectric layer serves for intermediate protection of the patterned line structures during bitline formation in the spaces between the patterned line structures.

In a preferred embodiment, the charge-trapping layer comprises silicon nitride.

In a preferred embodiment, the cap dielectric layer is removed from the patterned line structures by etching. This additional etching step serves to enable subsequent electrical contact between the first gate conductor layer and a second gate conductor layer, which is deposited later and forms part of the wordlines.

In a preferred embodiment, the cap dielectric layer is etched selectively to the insulating layer. Whereas the cap dielectric layer covers top surfaces of first gate conductor layer of the patterned line structures, the insulating layer covers (according to the first method of invention) the second conductor line portions or, alternatively (in case of the second method of the invention), the epitaxially grown conductor line portions.

In a preferred embodiment, the second stack of layers includes a second gate conductor layer contacting the first gate metal layer on the second gate conductor layer, the gate metal layer passing across the patterned line structures and the bitlines.

In a preferred embodiment, trenches extending along the second direction are formed, which trenches are cut through the patterned line structures. The trenches are extending in direction perpendicular to the first direction along which the bitlines extend. By etching the trenches, each patterned line structure extending along the first direction is divided into a plurality of line structure portions of quadratic contour (seen from top view), each line structure portion constituting a gate electrode of a respective memory cell.

A further embodiment of the invention provides an integrated memory device including a substrate comprising a substrate surface. The device also includes a plurality of bitlines extending along a first direction parallel to the substrate surface, the bitlines being covered with conductor line isolations, and a plurality of wordlines extending along a second direction parallel to the substrate surface, the second direction being different from the first direction and the wordlines being arranged more distant from the substrate surface than the bitlines. A plurality of memory cells is provided, each comprising a charge-trapping layer sandwiched between a first dielectric layer and a second dielectric layer, each memory cell being connected to two respective bitlines and to one respective wordline. The bitlines each include a diffusion line arranged in the substrate, a first conductor line portion arranged on the substrate surface including a silicidation barrier layer, and a second conductor line portion arranged on the first conductor line portion and comprising a metal.

According to an embodiment of the invention, a first memory device is provided including bitlines of improved conductivity, the bitlines including a conductive silicidation barrier layer arranged in direct contact with a diffusion line arranged in the substrate. The bitlines of the memory device further include a metal line arranged on the silicidation barrier layer. The silicidation barrier layer and the metal line form first and second conductor line portions of the bitlines. The first conductor lines portion formed of the silicidation barrier layer prevent silicide formation between the metal of the second conductor line portions and the diffusion lines. In particular, during manufacture of the memory device according to an embodiment of the invention, no silicidation and no subsequent phase transition of a silicide may occur during inevitable thermaltreatment steps can occur any longer. Accordingly, the electrical conductivity of the bitlines according to an embodiment of the invention is particularly high and a larger number of memory cells is connectable to each bitline.

In a preferred embodiment, each silicidation barrier layer is formed of a conductive material comprising a metal nitride. Accordingly, a metal nitride is supporting the second conductor line portion of the respective bitline.

In a preferred embodiment, each silicidation barrier layer comprises titanium nitride. The material of the silicidation barrier layer may also include a nitride of titanium and yet another metal.

In a preferred embodiment, each second conductor line portion is a metal layer. The second conductor line portions may also be formed of a metal alloy of two or more metals.

In a preferred embodiment, each second conductor line portion comprises one of the metals of the group of Al, Cu, W, Ti, Ni and Co.

Another embodiment of the invention provides an integrated memory device including a substrate comprising a substrate surface. The device also includes a plurality of bitlines extending along a first direction parallel to the substrate surface, the bitlines being covered with conductor line isolations, and a plurality of wordlines extending along a second direction parallel to the substrate surface, the second direction being different from the first direction and the wordlines being arranged more distant from the substrate surface than the bitlines. A plurality of memory cells is provided, each comprising a charge-trapping layer sandwiched between a first dielectric layer and a second dielectric layer, each memory cell being connected to two respective bitlines and to one respective wordline. The bitlines each include a diffusion line arranged in the substrate and a conductor line portion arranged on the substrate surface and including a monocrystalline doped semiconductor material.

According to this second memory device of the invention, an epitaxially grown doped semiconductor material (which thus is a monocrystalline doped semiconductor material) is provided in direct contact with the diffusion lines. Since the doped monocrystalline semiconductor material is arranged in contact with the substrate surface from which the diffusion lines extend into the substrate material, the monocrystalline conductor line portions are in direct contact with the diffusion lines connecting the memory cells. Accordingly, bitlines are provided which, due to the doped monocrystalline conductor line portions, increase the connectivity of the bitlines. Accordingly, a larger number of memory cells is connectable to and reliably operable by the bitlines. Since the monocrystalline doped semiconductor material is epitaxially grown on the semiconductor material and the substrate also is a semiconductor substrate, no Schottky contacts occur on the substrate surface between the diffusion lines and the conductor line portions.

In a preferred embodiment, each conductor line portion is made of a semiconductor material epitaxially grown on the substrate surface. In a preferred embodiment, the substrate is a silicon substrate and the conductor line portions are formed of doped monocrystalline silicon. In particular, the conductor line portions in a preferred embodiment comprise a dopant concentration larger than $10^{19}/cm^3$.

Hereinbelow preferred embodiments of both the first and second memory device according to the invention are identified.

In a preferred embodiment, the memory cells are flash memory cells being programmable individually, the memory cells constituting a memory array of the memory device, wherein the memory array comprises a plurality of sectors and wherein in each sector the memory cells of the respective sector being commonly erasable in case of an erase operation performed in the respective sector. Accordingly, if any of the memory cells of the particular sector are erased, all other memory cells of the same sector are also erased.

In a preferred embodiment, the charge-trapping layer of each memory cell is a silicon nitride layer. Accordingly, each memory cell comprises a silicon nitride layer portion being a maintained portion of the deposited and patterned silicon nitride layer. The diffusion lines in a preferred embodiment may comprise an n-type dopant arranged in the substrate. Alternatively, they may comprise a p-type dopant. In any case, the dopant comprised in the doped semiconductor material of the conductor line portions of the second memory device of the invention is the same type of dopant (n or p, respectively) as the type of dopant comprised in the diffusion lines.

In a preferred embodiment, the diffusion line of each bitline is connecting two respective rows of memory cells adjacent to the respective bitline. Thereby, a virtual ground array is constituted.

In a preferred embodiment, spacers are arranged between sidewalls of gate stacks and the conductor line portions of the bitlines. The spacers may be formed of an oxide, like silicon oxide.

In a preferred embodiment, the conductor line portions covering the bitlines comprise an oxide. The conductor line isolations may also be formed of silicon oxide.

Finally, the gate stacks of the memory cells in a preferred embodiment are each covered with a cap dielectric layer made of a different material than the material of the conductor line isolations covering the bitlines. The cap dielectic layer may be formed of silicon nitride.

BRIEF DESCRIPTION OF THE DRAWINGS

For a more complete understanding of the present invention, and the advantages thereof, reference is now made to the following descriptions taken in conjunction with the accompanying drawing, in which:

FIGS. 11 and 12 illustrate method steps of a second method according to an embodiment of the invention;

FIG. 13 illustrates a cross-sectional view of a first embodiment of the memory device of FIGS. 9 and 10;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
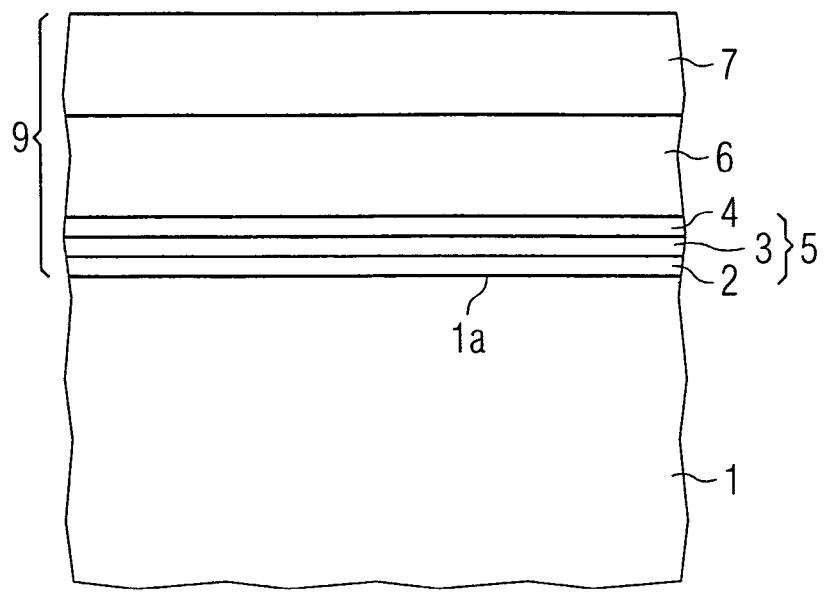
FIGS. 1 to 8 illustrate method steps of a first method according to an embodiment of the invention.

According to FIG. 1 a substrate 1 comprising a substrate surface 1*a* is provided. On the substrate surface 1*a* a first stack of layers 9 is formed by depositing, on one another, a first dielectric layer 2, a charge-trapping layer 3, a second dielectric layers 2, 4, a first gate conductor layer 6 and a cap dielectric layer 7. The first stack of layers 9 formed thereby serve to form lower regions of gate stacks. The first and second dielectric layer in a preferred embodiment may be oxide layers, for instance silicon oxide layers. The substrate 1 may be a silicon substrate, for instance. The charge-trapping layer 3 in a preferred embodiment may be silicon nitride layer. The layers 2, 3 and 4 combinedly form the charge-trapping layer stack 5 since this stack serves to store electrical charges in locally bound positions. In a preferred embodiment the charge-trapping layer stack 5 is an ONO layer stack (oxide-nitride-oxide).

Figure 2:
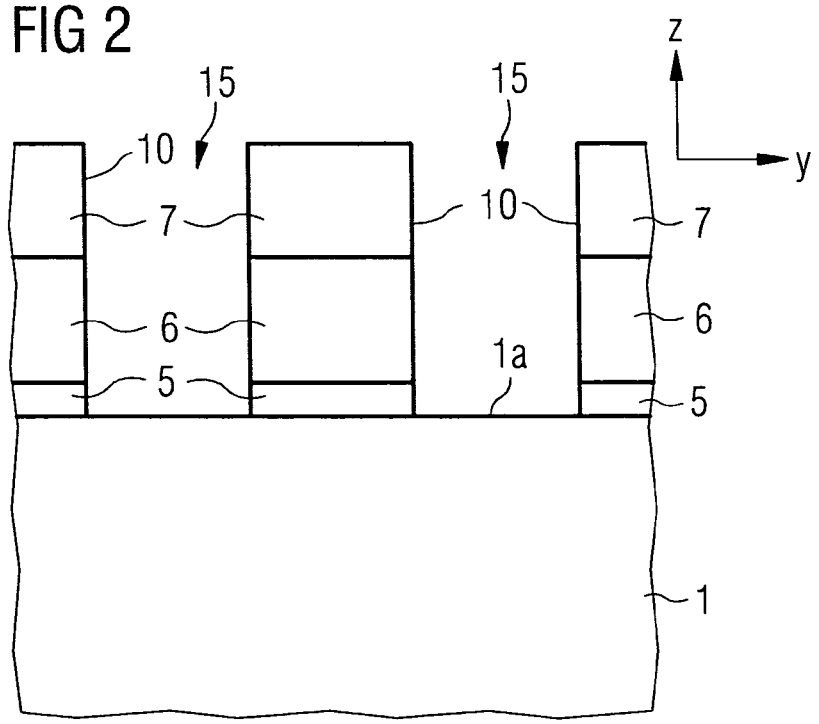

According to FIG. 2 the first stack of layers 9 is patterned, thereby forming a plurality of patterned line structures 10 extending along a first lateral direction x parallel to the substrate surface 1*a* and being separated, in a second direction y parallel to the substrate surface, by longitudinal spaces 15. The mask used for patterning the first stack of layers 9 to obtain the patterned line structures 10 is not explicitly illustrated in FIGS. 1 and 2. The substrate surface 1a is exposed in the spaces 15 between the patterned line structures 10.

Figure 3:
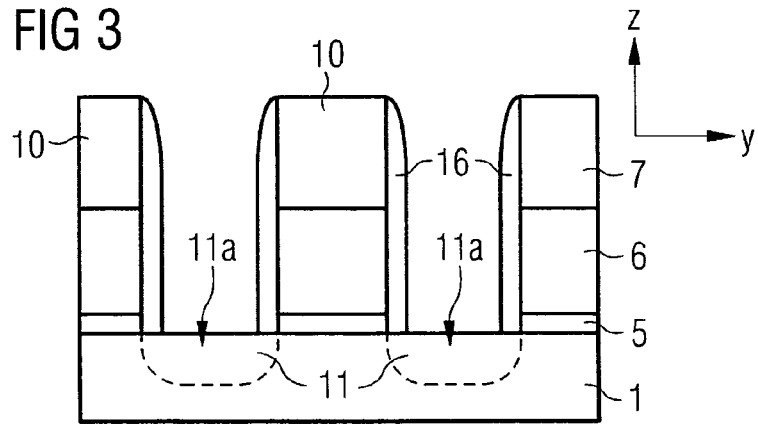

According to FIG. 3, spacers 16 are formed on sidewalls of the patterned line structures 10 and a dopant 11a is implanted into the substrate using the patterned line structures 10 as a mask. Thereby a plurality of diffusion lines 11 is formed below the substrate surface 1a, each diffusion line 11 providing source/drain regions for a plurality of memory cells of two patterned line structures 10 arranged on opposed sides of the respective diffusion line 11. The dopants 11a forming the diffusion lines may be n-doped, for instance.

According to an embodiment of the invention, an electrically conductive silicidation barrier layer 12 is deposited on the substrate surface 1a exposed between the patterned line structures 10. For instance, the silicidation layer may be deposited all over the substrate and may be etched back, thereby maintaining one respective silicidation barrier layer portion in each space 15 between two patterned line structures 10. In any case, the silicidation barrier layer 12 is arranged on the substrate surface 1a in direct contact with the diffusion lines 11. Upon partial back etching of the silicidation layer 12, for instance, a plurality of first conductor line portions 22 is formed of the material of the maintained portions of the silicidation layer 12. The first conductor line portions 22 formed of the silicidation barrier layer are preventing silicidation of a metallic material deposited subsequently. In absence of the silicidation barrier layer 12 forming the first conductor line portions 22, any metal deposited subsequently would be deposited onto the substrate surface 1a directly. During thermal treatment steps like thermal anneal (like implant activation anneals or furnace processes for material deposition), a metal silicide could be formed on the exposed substrate surface and could be subject to phase transistion, thereby reducing bitline conductivity. However, according to an embodiment of the invention, the above-mentioned first conductor line portions 22 formed of the silicidation barrier layer 12 are preventing metal silicide formation.

Subsequent to formation of the first conductor line portions, a conductive layer 13 is deposited on the silicidation barrier layer 12. The conductive layer 13 comprises a metal. In a preferred embodiment the conductive layer 13 is a metal or metal alloy layer. The metal for instance may be Al, Cu, W, Ti, Ni or Co. However, the conductive layer 13 may comprise any other metal prone to silicidation when being heated in contact with silicon.

Figure 4:
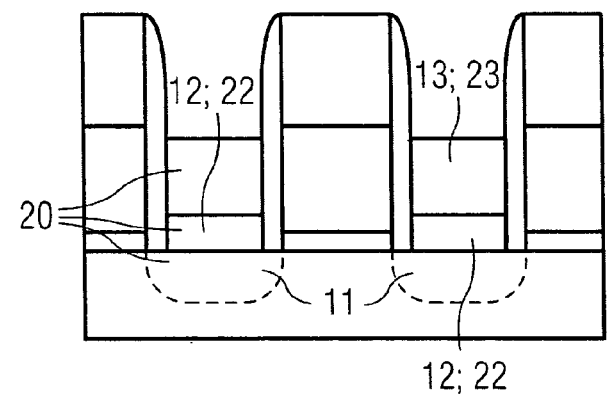

As illustrated in FIG. 4, second conductor line portions 23 are formed, of the conductive layer 13, the second conductor line portions 23 being arranged on the first conductor line portions 22. Upon partial back etching of the conductive layer 13, for instance, the plurality of second conductor line portions 23 is formed using the maintained portions of material of the conductive layer 13.

According to an embodiment of the invention, the bitlines 20 are formed which bitlines comprise the diffusion lines 11, the first conductor line portions 22 and the second conductor line portions 23.

Figure 5:
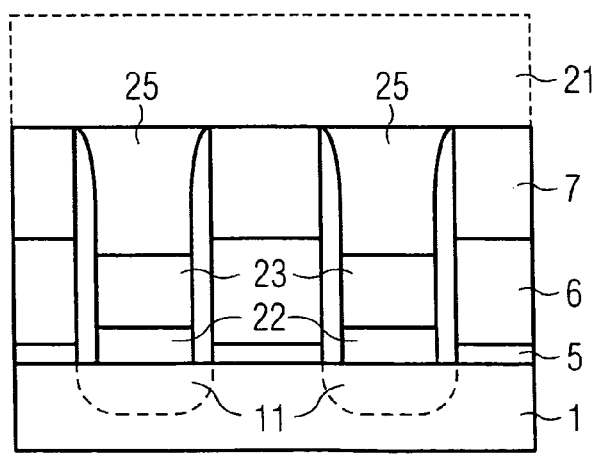

According to FIG. 5, conductor line isolations 25 are formed on the bitlines, for instance by depositing dielectric material like an oxide and planarizing and/or back etching the dielectric material. The cap dielectric layer 7, for instance silicon nitride, may be used as an etch stop for planarizing the conductor line isolations 25 by chemical-mechanical polishing.

Figure 6:
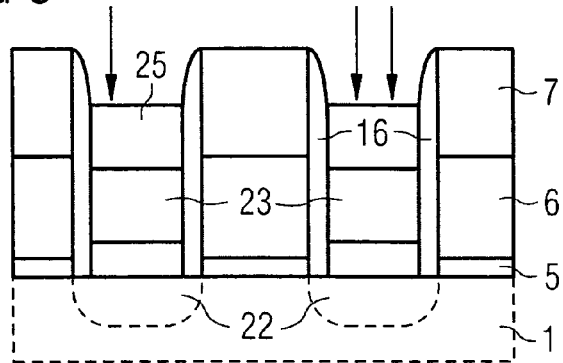

FIG. 6 illustrates the optional step of further back etching the conductor line isolation 25. Upper portions of the separate conductor lines 25 are recessed in order to reduce the topography in view of the subsequent method step of FIG. 7.

During back etching as illustrated in FIG. 6, the spacers 16 may be etched simultaneously, in particular in case that both the conductor line isolations 25 as well as the spacers 16 are formed of an oxide.

Figure 7:
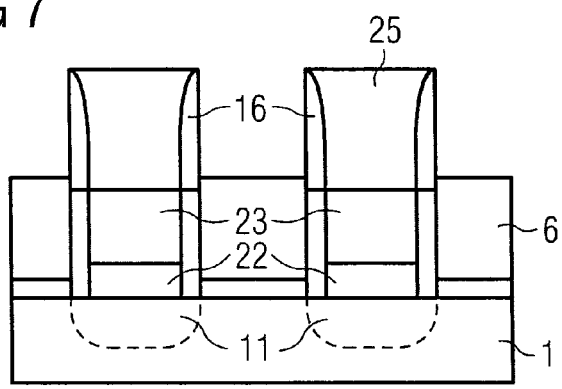

According to FIG. 7, the cap dielectric layer 7 is removed, preferably by etching selectively to the first gate conductor layer 6 and to the material of the spacers 16 and of the conductor line isolations 25. In FIG. 7 the vertical extension of the conductor line isolations 25 is illustrated corresponding to FIG. 5 rather than corresponding to FIG. 6 since the step of back etching of FIG. 6 is optional. The back etching step for reducing the vertical extension of the conductor line isolations 25 may be an oxide deglaze step. This step serves to improve planarity.

As illustrated in FIG. 7, the dielectric cap layer 7 has been removed completely and the first gate conductor layer 6 is exposed. Accordingly, the dielectric cap layer 7 of the patterned line structures 10 has been removed completely.

Figure 8:
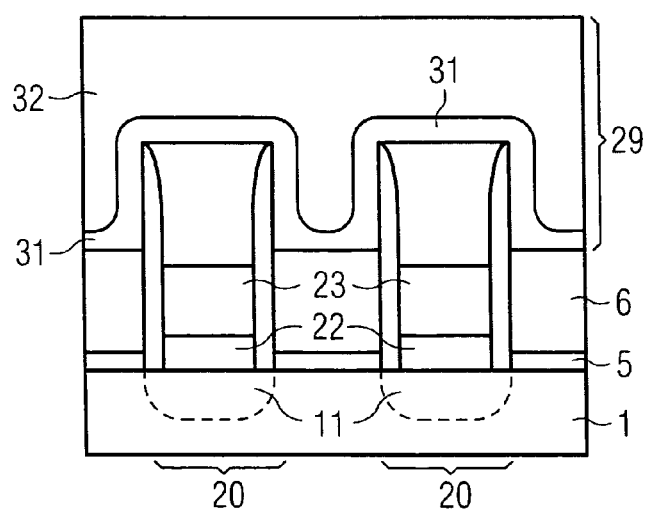

According to FIG. 8, a second stack of layers 29 is deposited, the second step of layers comprising a second gate conductor layer 31 and a gate metal layer 32. The first gate conductor layer 6 may be a polysilicon layer. The second gate conductor layer 31 also may be a polysilicon layer. The polysilicon layer 31 may be deposited conformably, for instance.

Subsequently the second stack of layers 29 is patterned, thereby forming wordlines 30 extending along the second direction y parallel to the substrate surface 1a (perpendicular to the first direction x). Thereby the patterned line structures 10 of FIGS. 2 to 8 are patterned in order to obtain a plurality of patterned line structure portions.

Figure 9:
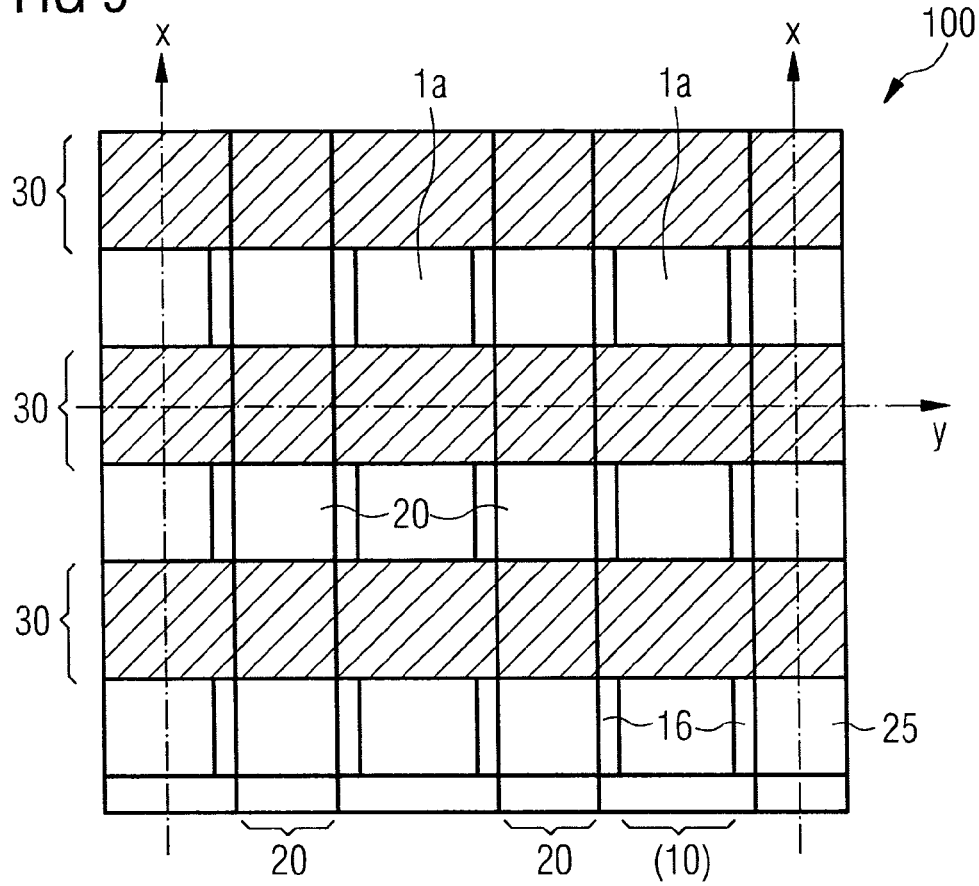
FIG. 9 illustrates a top view of a memory device formed according to an embodiment of the invention.

FIG. 9 illustrates a top view of the memory device of FIG. 8 after patterning of the second stack of layers 29 and etching through the patterned line structures 10. As illustrated in FIG. 9, a plurality of wordlines 30 is formed of the remaining line-shaped portions of layers 31 and 32. Between the wordlines 30, etching is continued, thereby etching in regions in which bitlines 20 pass above the substrate surface, down to the conductor line isolations 25 protecting and isolating the bitlines. Between the bitlines 20, in those regions where the first gate conductor layer 6 and the charge-trapping layer 5 are exposed, these layers are removed by etching, thereby again exposing in the substrate surface 1a. Thereby a plurality of memory gate stacks 41 each having a nearly quadratic ground surface on the substrate surface is formed, each gate stack 41 constituting a memory cell structure.

Figure 10:
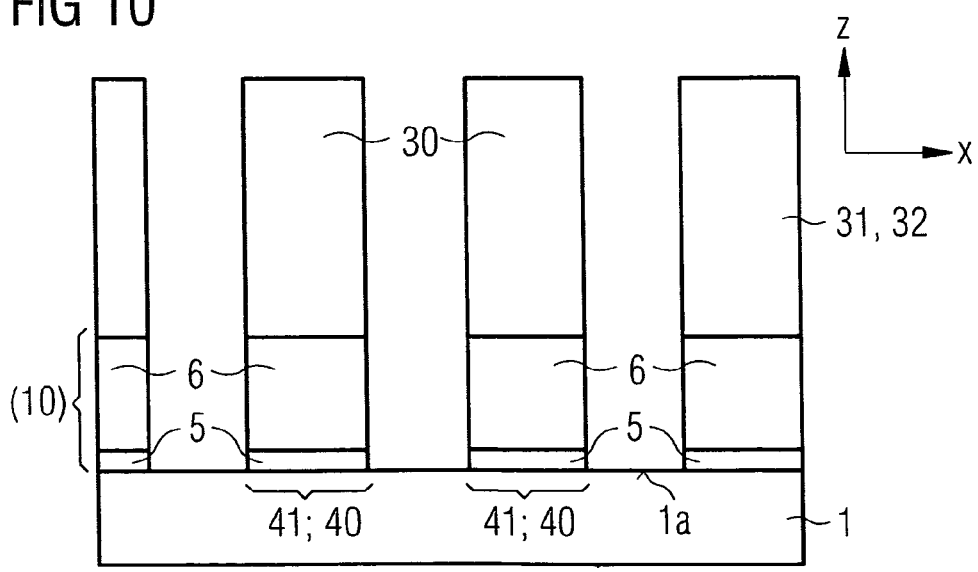
FIG. 10 illustrates a cross-sectional view of the memory device of FIG. 9.

FIG. 10 illustrates a cross-sectional view along the first direction x after forming the wordlines 30 and etching through the patterned line structures 10. Since, according to FIG. 7, the cap dielectric layer 7 has been removed from the patterned line structures 10, the patterned line structures 10 only comprise the charge-trapping layer stack 5 and the first gate conductor layer 6 when depositing the second gate conductor layer 31 and the gate metal layer 32 thereon and patterning them for forming the wordlines 30. The cross-sectional view of FIG. 10 corresponds to a portion of the memory device arranged between two adjacent bitlines extending parallel to the drawing plane. Whereas the bitlines running along the first direction x are continuously propagating above and below the drawing plane along the first direction x, the patterned line structures 10 illustrated within the drawing plane have been patterned further so as to obtain a plurality of gate stacks 41 constituting the memory cells 40. Subsequently, the spaces etched between the gate stacks 41 will be filled with dielectric filling material. Along the second direction y, the memory cells 40 are separated from one another by bitlines 20 as illustrated in FIG. 8.

FIGS. 11 and 12 illustrate method steps of a second method according to an embodiment of the invention. In FIGS. 11 and 12 only those steps different from steps of the first method of the invention are illustrated.

The second method according to an embodiment of the invention starts as in FIGS. 1 to 3. The second method then proceeds with epitaxially growing a doped semiconductor material 14 onto the substrate surface 1a exposed in the bottom of the spaces 15 between the patterned line structures 10. Thereby the monocrystalline semiconductor layer covers each space 15 and a plurality of conductor line portions 24 is obtained. The conductor line portions 24 formed of the heavily doped semiconductor material significantly increase the conductivity of the bitlines 20.

The second method then proceeds with covering the bitlines 20 with the conductor line isolation 25 as illustrated in FIG. 12. FIG. 12 corresponds to FIG. 5 except for the internal construction of the bitlines 20. The second method then proceeds as illustrated in FIGS. 6 to 10 in which the first and second conductor line portions 22, 23 have to be replaced, for illustrating the second method of the invention rather than the first method, by the conductor line portions 24 for each bitline 20. The conductor line portions 24 preferably comprise monocrystalline silicon heavily doped with an n-dopant, preferably As or P. According to this second method, a second memory device illustrated in FIGS. 9 and 10 is formed. The bitlines not illustrated in the cross-sectional view of FIGS. 9 and 10 comprise, in contrast to the memory device formed according to the first method, the conductor line portions 24 rather than the first and second conductor line portions 22 and 23.

The internal construction of the bitlines of the memory device according to the first and second embodiments is not illustrated in FIGS. 9 and 10. However, these features are illustrated in FIGS. 13 and 14.

FIG. 13 illustrates a cross-sectional view along the first direction and through the bitlines 20. The bitlines 20 include the diffusion lines 11 in the substrate 1, the diffusion lines 11 extending from the substrate surface 1a into the substrate material. On the substrate surface 1a the first conductor line portions 22 (comprising a silicidation barrier layer preferably formed of titanium nitride) is arranged. On the first conductor line portions 22, the second conductor line portions 23 are provided, which preferably are formed of a metal, like a metal subject to silicidation in case that the silicidation barrier layer material of the first conductor line portions 22 were absent. The bitlines 20 are protected from the vertical direction z by the conductor line isolations 25. Above the conductor line isolation 25, the wordlines 30 formed of the second gate conductor layer and the gate metal layer are extending along a second direction y perpendicular to the drawing plane.

Figure 14:
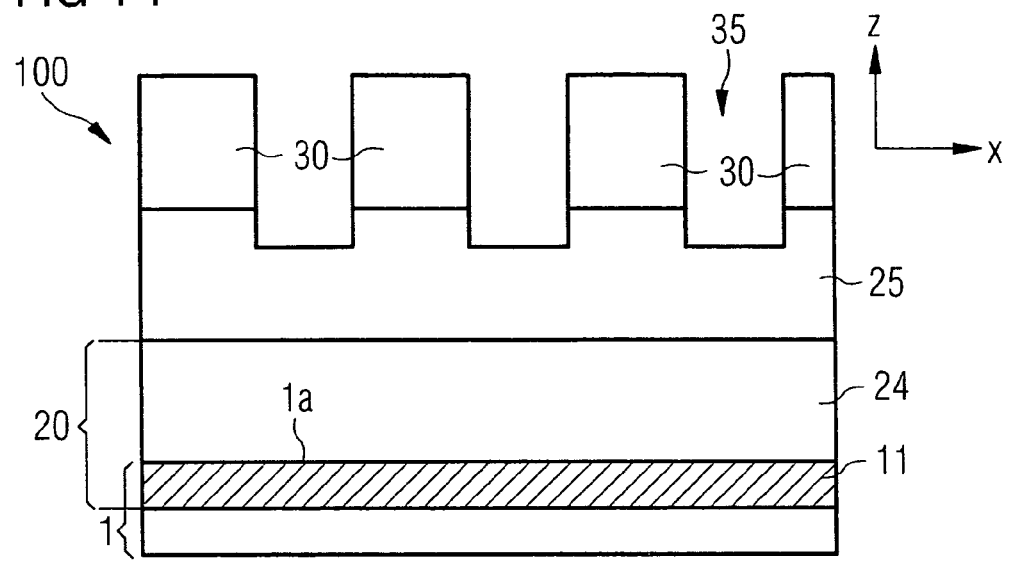
FIG. 14 illustrates a cross-sectional view of a second embodiment of the memory device of FIGS. 9 and 10.

FIG. 14 illustrates the cross-sectional view corresponding to FIG. 13 but illustrates a second memory device according to an embodiment of the invention, which has been formed by the second method of the invention. On the substrate surface 1a of the substrate 1, conductor line portions 24 comprising an epitaxially grown, highly doped monocrystalline semiconductor material like n$^+$-doped silicon, for instance, are provided. The bitlines 20 thus formed have a significantly increased conductivity and may be used for controlling a significantly larger number of memory cells connected thereto. Accordingly, larger virtual-ground-arrays of flash memory devices may be formed.

Figure 15:
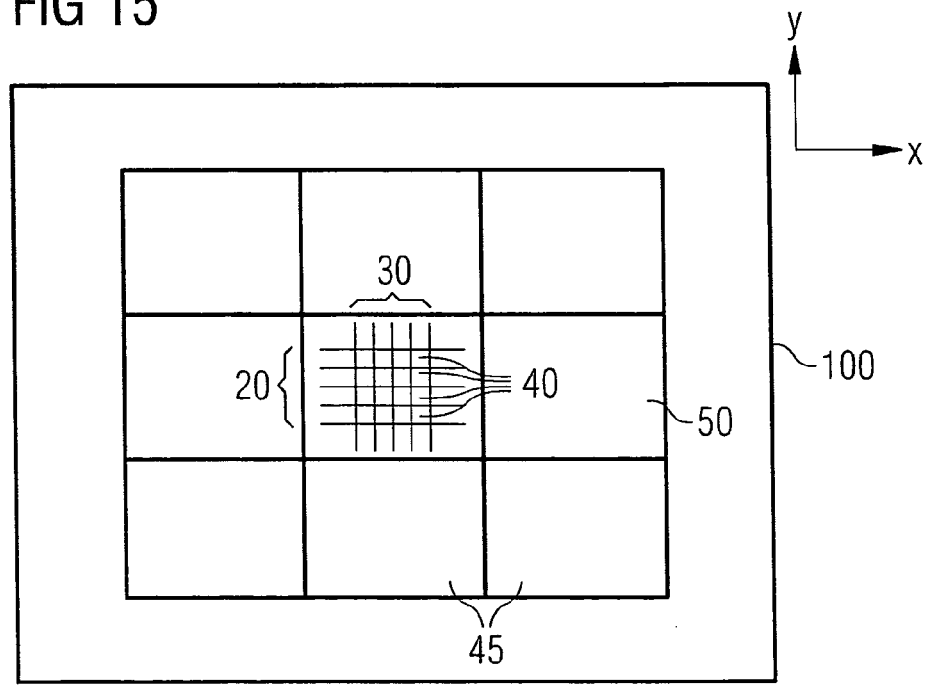
FIG. 15 illustrates a schematical top view of a memory device.

Finally, FIG. 15 schematically illustrates a top view of a memory device. The memory device 100 comprises a memory array 50 comprising a plurality of sectors 45, in each sector a plurality of memory cells 40 being connected to plural bitlines 20 and to plural wordlines 30. The memory array 50 comprises a virtual-ground-array in each sector 45. All memory cells 40 of the particular sector are, in case of a flash memory device like an NROM device, erased commonly if an erase operation is performed in the respective sector. Due to the bitline construction according to preferred embodiments of the invention, larger virtual-ground-arrays may be formed with an increased number of memory cells connected to each bitline.

Although the present invention and its advantages have been described in detail, it should be understood that various changes, substitutions and alterations can be made herein without departing from the spirit and scope of the invention as defined by the appended claims.

What is claimed is:

1. An integrated memory device comprising:
a substrate comprising a substrate surface;
a plurality of bitlines extending along a first direction parallel to the substrate surface, the bitlines being covered with conductor line isolations, wherein the bitlines each include: a diffusion line arranged in the substrate, a first conductor line portion arranged over the substrate surface and comprising a silicidation barrier layer and a second conductor line portion arranged on the first conductor line portion and comprising a metal;
a plurality of wordlines extending along a second direction parallel to the substrate surface, the second direction being different from the first direction and the wordlines being arranged more distant from the substrate surface than the bitlines; and
a plurality of memory cells each comprising a charge-trapping layer sandwiched between a first dielectric layer and a second dielectric layer, each memory cell being electrically connected to two respective bitlines and to one respective wordline.

2. The memory device of claim 1, wherein each silicidation barrier layer comprises a conductive metal nitride.

3. The memory device of claim 2, wherein each silicidation barrier layer comprises titanium nitride.

4. The memory device of claim 1, wherein each second conductor line portion comprises a metal layer.

5. The memory device of claim 4, wherein each second conductor line portion comprises a metal selected from the group consisting of Al, Cu, W, Ti, Ni, and Co.

6. The memory device of claim 1, wherein the memory cells comprise flash memory cells that are programmable individually, the memory cells being arranged in a memory array that comprises a plurality of sectors, in each sector the memory cells of the respective sector being commonly erasable in case of an erase operation performed.

7. The memory device of claim 6, wherein the charge-trapping layer of each memory cell comprises a silicon nitride layer.

8. The memory device of claim 1, wherein the diffusion lines comprise an n-type dopant arranged in the substrate.

9. The memory device of claim 1, wherein each diffusion line of a bitline electrically connects two respective rows of memory cells adjacent to the respective bitline.

10. The memory device of claim 1, further comprising spacers arranged between sidewalls of gate stacks of the memory cells and conductor line portions of the bitlines.

11. The memory device of claim 10, wherein the spacers comprise oxide spacers.

12. The memory device of claim 1, wherein the conductor line isolations covering the bitlines comprise an oxide.

13. The memory device of claim 1, wherein the gate stacks of memory cells are each covered with a cap dielectric layer, the cap dielectric layer being made of a material different from the material of the conductor line isolations covering the bitlines.

14. An integrated memory device comprising:
a substrate comprising a substrate surface;
a plurality of bitlines extending along a first direction parallel to the substrate surface, the bitlines being covered with conductor line isolations, wherein the bitlines each include: a diffusion line arranged in the substrate and a conductor line portion arranged over the substrate surface and comprising a monocrystalline doped semiconductor material;
a plurality of wordlines extending along a second direction parallel to the substrate surface, the second direction being different from the first direction and the wordlines being arranged more distant from the substrate surface than the bitlines; and
a plurality of memory cells each comprising a charge-trapping layer sandwiched between a first dielectric layer and a second dielectric layer, each memory cell being electrically connected to two respective bitlines and to one respective wordline.

15. The memory device of claim 14, wherein each conductor line portion comprises a semiconductor material epitaxially grown on the substrate surface.

16. The memory device of claim 15, wherein the substrate comprises a silicon substrate and wherein the conductor line portions are formed of doped monocrystalline silicon.

17. The memory device of claim 14, wherein the conductor line portions comprise a dopant concentration greater than $10^{19}/cm^3$.

18. The memory device of claim 14, wherein the memory cells comprise flash memory cells that are programmable individually, the memory cells being arranged in a memory array that comprises a plurality of sectors, in each sector the memory cells of the respective sector being commonly erasable in case of an erase operation performed.

19. The memory device of claim 18, wherein the charge-trapping layer of each memory cell comprises a silicon nitride layer.

20. The memory device of claim 14, wherein the diffusion lines comprise an n-type dopant arranged in the substrate.

21. The memory device of claim 14, wherein each diffusion line of a bitline electrically connects two respective rows of memory cells adjacent to the respective bitline.

22. The memory device of claim 14, further comprising spacers arranged between sidewalls of gate stacks of the memory cells and conductor line portions of the bitlines.

23. The memory device of claim 22, wherein the spacers comprise oxide spacers.

24. The memory device of claim 14, wherein the conductor line isolations covering the bitlines comprise an oxide.

25. The memory device of claim 14, wherein the gate stacks of memory cells are each covered with a cap dielectric layer, the cap dielectric layer being made of a material different from the material of the conductor line isolations covering the bitlines.

26. An integrated memory device comprising:
a substrate comprising a substrate surface;
a plurality of bitlines extending along a first direction parallel to the substrate surface, the bitlines being covered with conductor line isolations, wherein the bitlines each include: a diffusion line arranged in the substrate and a conductor line portion arranged in contact with the diffusion line in the substrate surface and comprising a monocrystalline doped semiconductor material;
a plurality of wordlines extending along a second direction parallel to the substrate surface, the second direction being different from the first direction and the wordlines being arranged more distant from the substrate surface than the bitlines; and
a plurality of memory cells each comprising a charge-trapping layer sandwiched between a first dielectric layer and a second dielectric layer, each memory cell being electrically connected to two respective bitlines and to one respective wordline.

* * * * *